United States Patent
Bhakta et al.

(10) Patent No.: US 9,426,916 B1
(45) Date of Patent: Aug. 23, 2016

(54) ARRANGEMENT OF MEMORY DEVICES IN A MULTI-RANK MEMORY MODULE

(71) Applicant: Netlist, Inc., Irvine, CA (US)

(72) Inventors: Jayesh R. Bhakta, Cerritos, CA (US); Son H. Nguyen, Rolling Hills Estate, CA (US)

(73) Assignee: Netlist, Inc., Irvine, CA (US)

( * ) Notice: Subject to any disclaimer, the term of this patent is extended or adjusted under 35 U.S.C. 154(b) by 194 days.

(21) Appl. No.: 13/964,103

(22) Filed: Aug. 11, 2013

Related U.S. Application Data

(60) Provisional application No. 61/682,249, filed on Aug. 11, 2012.

(51) Int. Cl.
*G11C 5/02* (2006.01)
*H05K 7/06* (2006.01)
*G11C 8/12* (2006.01)

(52) U.S. Cl.
CPC .. *H05K 7/06* (2013.01); *G11C 8/12* (2013.01); *G11C 5/02* (2013.01); *G11C 5/025* (2013.01)

(58) Field of Classification Search
CPC ............ H05K 7/06; G11C 5/04; G11C 5/025; G11C 8/12
USPC .......................................................... 365/51
See application file for complete search history.

(56) References Cited

U.S. PATENT DOCUMENTS

| | | | | |
|---|---|---|---|---|
| 7,359,257 B2* | 4/2008 | RaghuRam | ............... | G11C 5/04 365/191 |
| RE43,162 E * | 2/2012 | RaghuRam | ............... | G11C 5/04 365/191 |
| 8,417,870 B2* | 4/2013 | Lee | ............... | G11C 5/04 711/100 |
| 8,819,356 B2* | 8/2014 | Rajan | ............... | G06F 12/00 711/154 |
| 9,128,632 B2* | 9/2015 | Lee | ............... | G06F 3/0659 |
| 2007/0201256 A1* | 8/2007 | RaghuRam | ............... | G11C 5/04 365/51 |
| 2010/0157645 A1* | 6/2010 | Harashima | ............... | G11C 5/04 365/51 |
| 2011/0016269 A1* | 1/2011 | Lee | ............... | G11C 5/04 711/105 |
| 2012/0281348 A1* | 11/2012 | Harashima | ............... | G11C 5/04 361/679.32 |
| 2013/0117495 A1* | 5/2013 | Rajan | ............... | G06F 12/00 711/102 |
| 2014/0337539 A1* | 11/2014 | Lee | ............... | G06F 3/0659 710/5 |

* cited by examiner

*Primary Examiner* — Pho M Luu
*Assistant Examiner* — Xiaochun L Chen
(74) *Attorney, Agent, or Firm* — Jamie J. Zheng, Esq.

(57) ABSTRACT

A multi-rank memory module is operable in a memory system with a memory controller. The memory module according to one embodiment comprises at least one module board, memory devices organized in three ranks, and at least one register device providing control/address signals to the memory devices. Arrangement of the ranks on the at least one module board are made to balance memory device loadings on the C/A signals, and data/strobe signal hubs are designed to provide better alignment of different data bits in a data signal and to reduce reflection from discrete components disposed near an edge of the module board, resulting in improved signal quality and integrity.

11 Claims, 12 Drawing Sheets

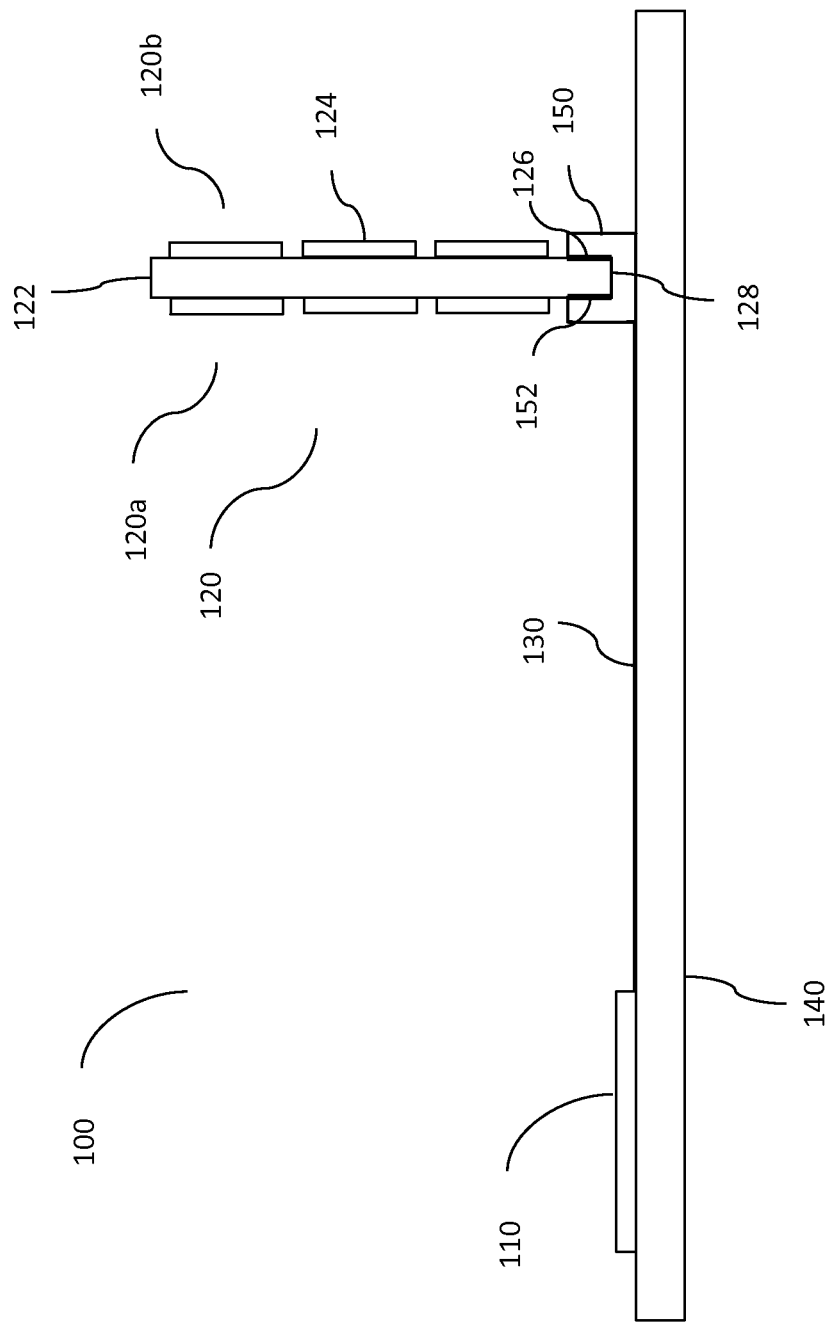

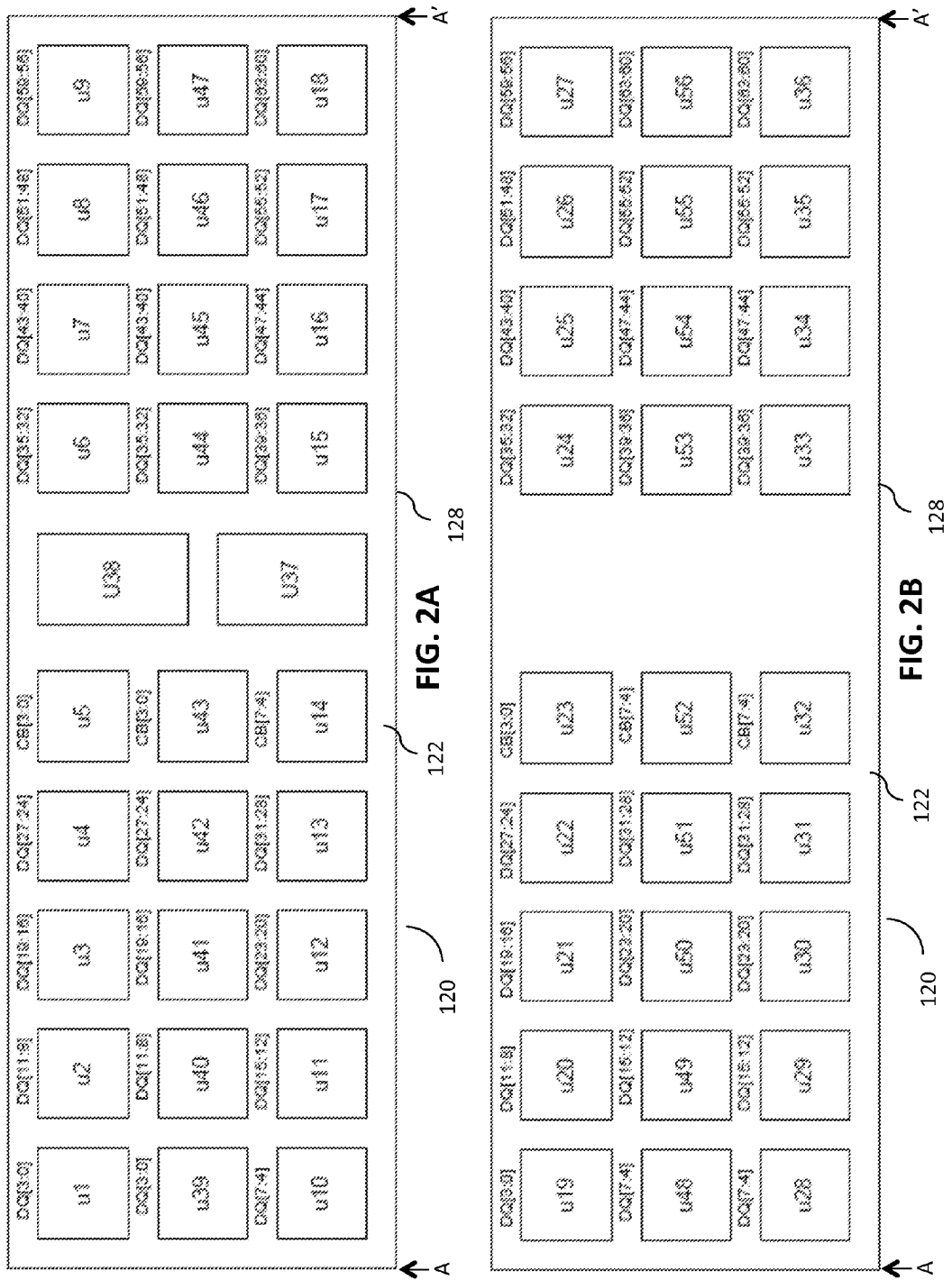

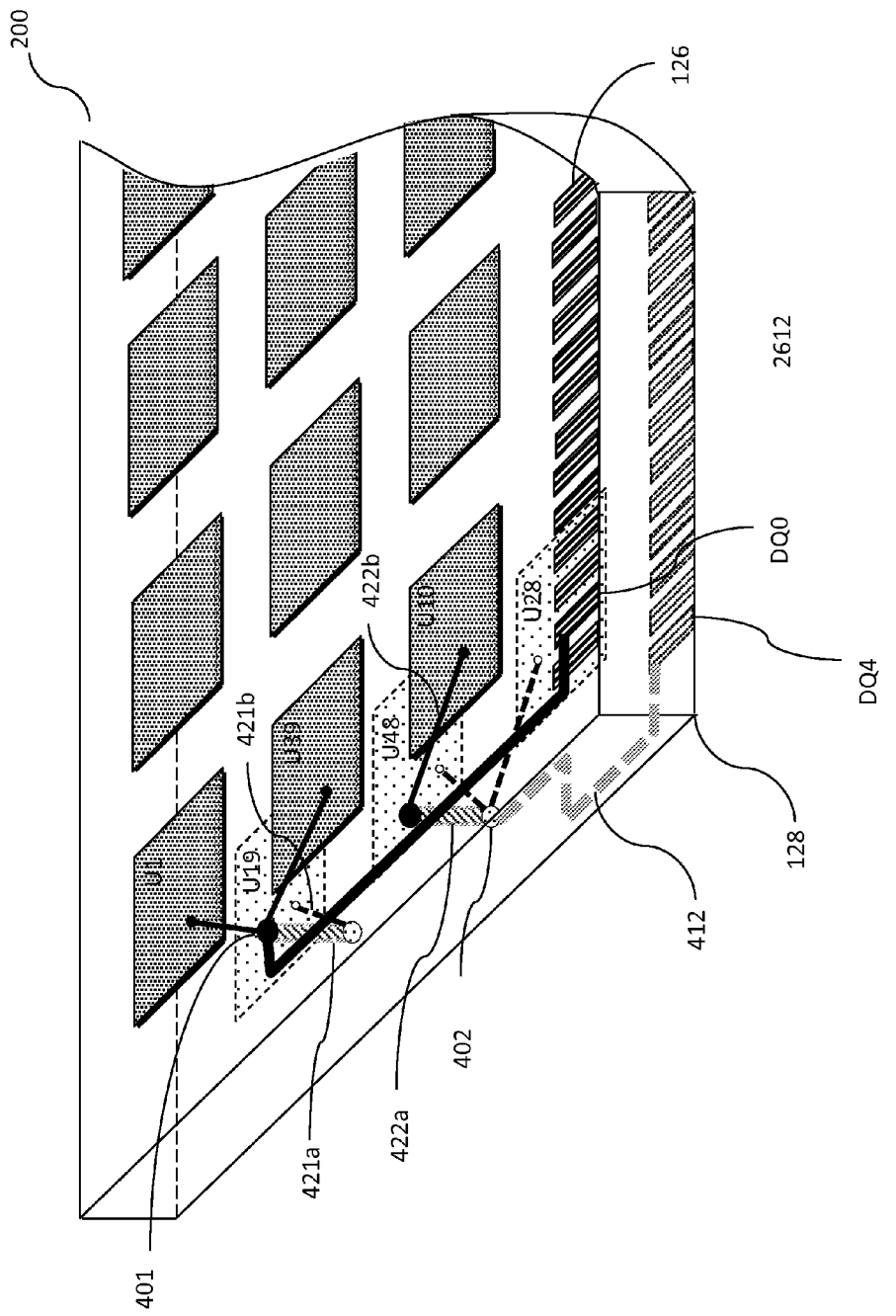

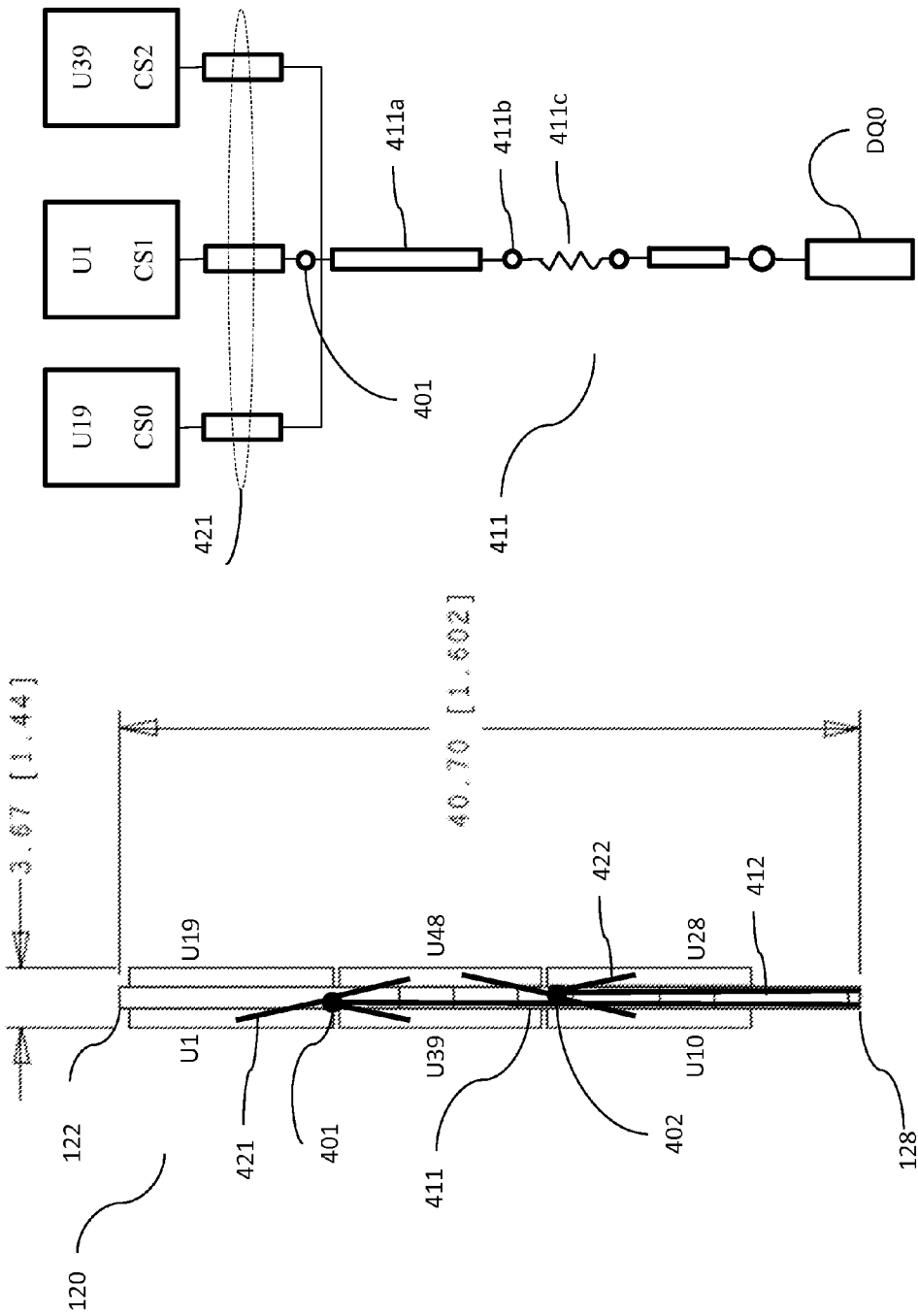

ARRANGEMENT OF MEMORY DEVICES IN A MULTI-RANK MEMORY MODULE

CLAIM OF PRIORITY

The present application claims priority to U.S. Provisional Application No. 61/682,249 filed on Aug. 11, 2012, which is incorporated herein by reference in its entirety.

FIELD

The disclosure herein is related generally to memory modules, and more particularly to multi-rank memory modules.

DESCRIPTION OF RELATED ART

The disclosure herein is related generally to memory modules, and more particularly to multi-rank memory modules.

BACKGROUND

Computer systems often utilize modules comprising one or more printed circuit boards (PCBs). Each PCB has one or more components (e.g., integrated circuits or ICs) mounted thereon, and the components can be mounted on one side or on both sides of the PCB. The one or more PCBs also include module connectors for coupling the components in the module to the computer system. For a memory module, the components may include memory devices that are organized in ranks such that the memory devices in a rank are selectable by a single chip select signal and, when selected, communicate respective data bits of a data signal. The memory module may also include one or more register devices to provide registered control/address signals to the memory devices. When the memory module has multiple ranks of memory devices, it is important that the multiple ranks of memory devices and their connections to respective module connectors are properly arranged to insure the quality and integrity of the data signals communicated thereto and therefrom. It is also helpful to balance their loads on the registered C/A signals.

SUMMARY

A multi-rank memory module is operable in a memory system with a memory controller. The memory module according to one embodiment comprises a module board having a first side and an opposing second side; and memory devices organized in three ranks. The memory devices in a first rank of the three ranks are all mounted on the first side, the memory devices in a second rank of the three ranks are all mounted on the second side, and the memory devices in a third rank of the three ranks include some memory devices mounted on the first side, and some memory devices mounted on the second side.

In certain embodiments, the multi-rank memory module further comprises module connectors along an edge of the module board and data/strobe signal hubs disposed away from the edge of the module board. The module connectors include data/strobe signal pins and control/address (C/A) signal pins, and each respective data/strobe signal hub is coupled to a respective data/strobe signal pin and to a respective set of first, second and third memory devices in different ranks. The respective data/strobe signal hub is positioned to reduce difference in lengths of first, second and third signal paths. The first signal path is between the respective data/strobe signal pin and the first memory device, the second signal path is between the respective signal pin and the second memory device, and the third signal path is between the respective data/strobe signal pin and the third memory device. Thus, better alignment of different data bits in a data signal is achieved. The data/strobe signal hubs are positioned away from the edge of the module board to reduce reflection from discreet components disposed near the edge of the module board, resulting in improved signal quality and integrity.

In certain embodiments, the data/strobe signal hubs include a first signal hub and a second signal hub coupled to respective ones of first data/strobe signal pin and second data/strobe signal pin. The multi-rank memory module further comprises a first signal trace between the first data/strobe signal pin and the first signal hub, and a second signal trace between the second data/strobe signal pin and the second signal hub. One of the first and second signal traces being routed to increase its length so as to reduce difference in lengths between the first signal trace and the second signal trace.

In certain embodiments, the multi-rank memory module further comprises a first register providing registered control/address (C/A) signals to memory devices in the first and second ranks, and a second register providing registered C/A signals to memory devices in the third rank.

In another embodiment, a multi-rank memory module comprises a main module board having a first side and an opposing second side, a first daughterboard coupled to the main module board and disposed on the first side of the main module board, and a second daughterboard coupled to the main module board and disposed on the second side of the main module board. The memory module further comprises memory devices organized in ranks, and each rank has a first portion of the memory devices therein mounted on the first daughter board and a second portion of the memory devices therein mounted on the second daughter board. The memory module further comprises a first register device providing registered C/A signals to memory devices mounted on the first daughter board, and a second register device providing registered C/A signals to memory devices mounted on the second daughter board.

In certain embodiment, each daughter board has a rigid portion and a flexible portion. Memory devices mounted on the rigid portion are coupled to the main module board via flexible traces on the flexible portion. The memory devices are organized in first, second and third ranks. The rigid portion of each respective daughter board has a first side and an opposing second side, and memory devices mounted on the respective daughter board include a first row of memory devices in the first rank mounted on a first side of the respective daughter board, a second row of memory devices in the second rank mounted on the first side of the respective daughter board, and a third row of memory devices in the third rank mounted on a second side of the respective daughter board.

In certain embodiments, the multi-rank memory module further comprises module connectors along an edge of the main module board and data/strobe signal hubs on the first and second daughter boards. The module connectors include data/strobe pins and each respective data/strobe signal hub is coupled to a respective one of the data/strobe pins and to a first memory device in the first rank, a second memory device in the second rank and a third memory device in the third rank. The respective data/strobe signal hub is positioned to reduce difference in lengths of first, second and third signal paths, the first signal path between the respective data/strobe signal pin and the first memory device, the second signal path between the respective signal pin and the second memory device, and the third signal path between the respective data/strobe signal pin and the third memory device.

In yes another embodiment, a multi-rank memory module comprises a module board, and module connectors along an edge of the module board via which the multi-rank memory module communicate respective bits of a data signal. The memory module further comprises dual-die packages (DDP) each including two stacked memory dies therein mounted the module board, and single-die packages (SDP) each having a single memory die therein mounted on the module board. Each SDP corresponds to a respective DDP and is disposed on an opposing side of the module board from the respective DDP. The each SDP and the respective DDP are coupled to a same subset of module connectors for communicating a subset of data bits of the data signal. The memory module further comprises at least one register device mounted on the module board and providing registered C/A signals to memory dies.

In certain embodiments, the at least one register comprises a first register device providing registered C/A signals to the DDPs and device a second register device providing registered C/A signals to the single-die packages.

In certain other embodiments, the at least one register device includes a single register device providing registered C/A signals to the DDPs and the SDPs.

In certain embodiments, the registered C/A signals include first, second and third chip select signals, and the memory die in the each SDP and the memory dies in the respective DDP receive respective ones of the first, second and third chip select signals.

BRIEF DESCRIPTION OF THE DRAWINGS

FIG. 1 is a block diagram of a memory system comprising a memory controller and a memory module coupled to a printed circuit board according to embodiments.

FIGS. 2A and 2B are block diagrams illustrating arrangement of memory devices on a memory module according to one embodiment of the present disclosure.

FIG. 4B is a three-dimensional view of certain data signal hubs and signal traces on a memory module according to an embodiment of the present disclosure.

FIG. 4C is a side view of a memory module illustrating certain data signal hubs and signal traces thereon according to one embodiment of the present disclosure.

FIG. 4D is a schematic diagram of electrical connections between certain memory devices and a respective module connector via a data signal hub and signal traces according to one embodiment of the present disclosure.

DESCRIPTION OF EMBODIMENTS

Figure 3A:
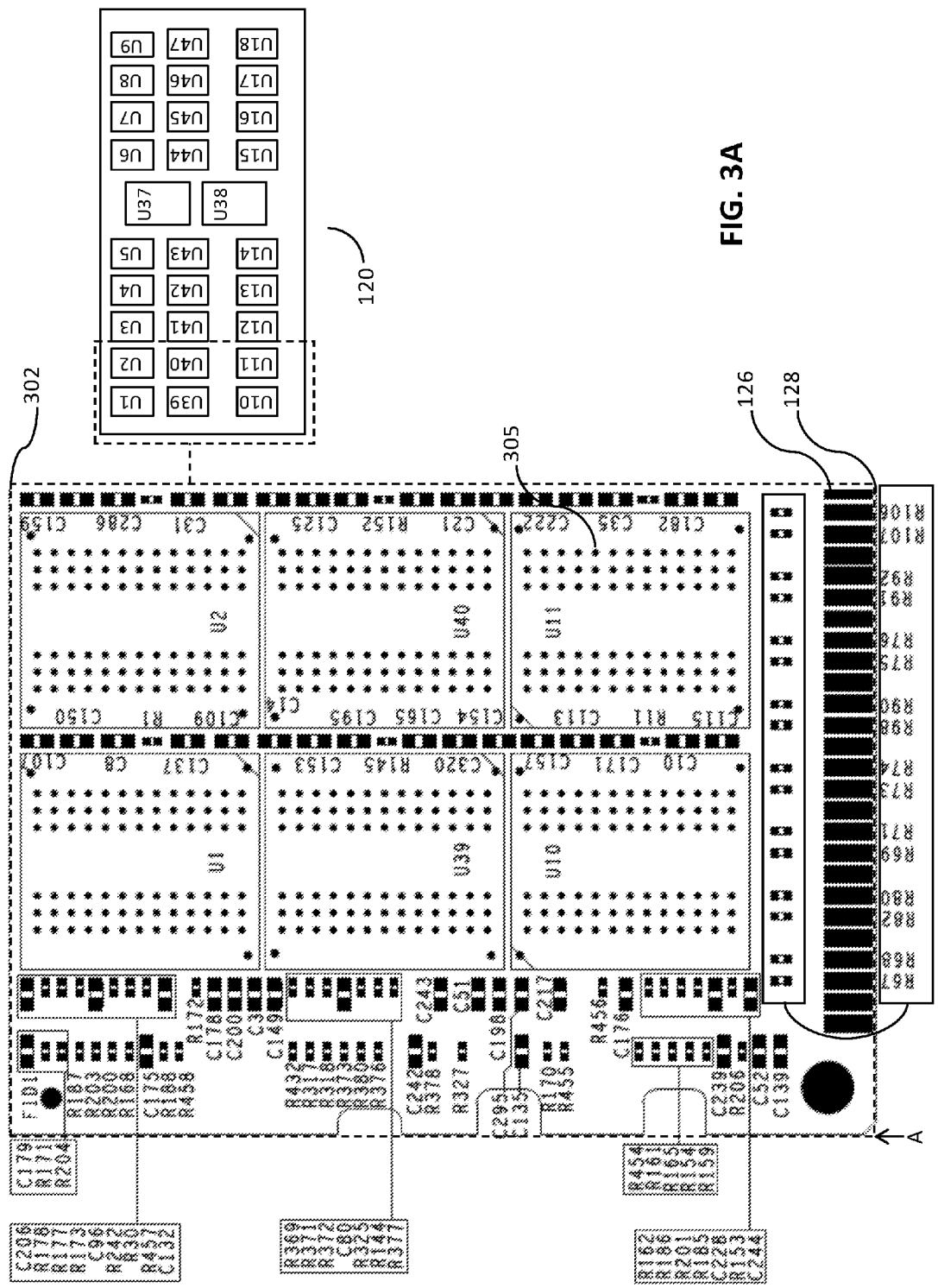
FIGS. 3A and 3B are zoomed in views of portions of a memory module according to an embodiment of the present disclosure.

As shown in FIG. 1, which illustrates a exemplary memory system 100 having a memory controller 110 and a memory module 120 coupled to each other by a memory bus 130. The memory module 120 includes at least one module board 122 and has a primary side (front side) 120a and a secondary side (back side) 120b, and memory devices 124 mounted on both the primary side 120a and the secondary side 120b. The memory module further includes module connectors 126 in the form of, for example, metal pins or pads formed on one or both sides of the module board and near a bottom edge 128 of the module board. The memory controller can be mounted on a circuit board 140, and the memory bus 130 includes signal lines, which can be signal traces on or in the circuit board 140. The module connectors are coupled to respective signal lines on the circuit board by, for example, inserting the bottom edge 128 of the module board into a slot or socket 150 on the circuit board 140, which may include metal contacts formed inside to facilitates connection of the module connectors with the respective signal lines in the memory bus 130.

In one embodiment, the memory module 120 can be a multi-rank registered DIMM (dual in-line memory module) compatible with the DDR3 (double data rate 3) standard published by JEDEC (the Joint Electron Devices Engineering Council). The memory devices can be DRAM (dynamic random access memory) devices, and the module board 122 can be a multi-layered printed circuit board. The present description may also apply to other types of memory modules and/or memory devices.

In the context of the present description, a rank refers to one or more memory devices that are selectable by a common chip-select (CL) signal, a memory controller refers to any device capable of sending instructions or commands, or otherwise controlling the memory devices, and a memory bus refers to any component, connection, or groups of components and/or connections, used to provide electrical communication between a memory module and a memory controller. For example, in various embodiments, the memory bus 105 may include printed circuit board (PCB) transmission lines, one or more sockets, module connectors, component packages, and/or any other components or connectors that provide connections for signal transmission.

FIGS. 2A and 2B are block diagrams of an exemplary memory module 120 illustrating memory devices arranged on the primary (front) side 120a and the secondary (back) side 120b, respectively, of the memory module 120. As shown, the memory module 120 according to one embodiment can have 9×6=54 memory devices, U1 to U36 and U39-U56, organized in first, second and third ranks. For example, the first rank includes memory devices U19-U36 on the back (secondary) side 120b of the memory module 120, which are selectable by a first chip select signal, the second rank includes memory devices U1-U18 on the front (primary) side 120a of the memory module 120, which are selectable by a second chip select signal, and the third rank includes memory devices U39-U47 on the primary side 120a and memory devices U48-U56 on the secondary side 120b of the module board 120, which are selectable by a third chip select signal.

In one embodiment, the memory devices in the first rank are arranged in two rows, with memory devices U19-U27 arranged in a first row from a left edge A of the module board 122 to a right edge A' of the module board 122, and memory devices U28-U36 arranged in a second row from the left edge A of the module board 122 to the right edge A' of the module board 122. Likewise, the memory devices in the second rank are arranged in two rows, with memory devices U1-U9 arranged in a third row from a left edge A of the module board 122 to a right edge A' of the module board 122, and memory devices U10-U18 arranged in a fourth row from the left edge A of the module board 122 to the right edge A' of the module board 122. The memory devices in the third rank are also arranged in two rows, with memory devices U39-U47 arranged in a fifth row from a left edge A of the module board 122 to a right edge A' of the module board 122 on the front side 120a, and memory devices U48-U66 arranged in a sixth row from the left edge A of the module board 122 to the right edge A' of the module board 122 on the back side 120b.

As also shown in FIGS. 2A and 2B, the memory module 120 further includes two register devices U37 and U38 both disposed on the primary side of the module board 122 near a middle portion between the left edge A and the right edge A' of the module board 122. In one embodiment, one of the register devices U37 and U38 provides control/address information to the first rank and the second rank, while the other one of the register devices U37 and U38 provides control/address information to the third rank. Other arrangements to allocate the memory devices with respect to the register devices are also possible and consistent with the present description. For example, in another embodiment, one of the register devices U37 and U38 provides control/address information to the second rank and the other one of the register devices U37 and U38 provides control/address information to the first rank and the third rank.

Figure 3B:
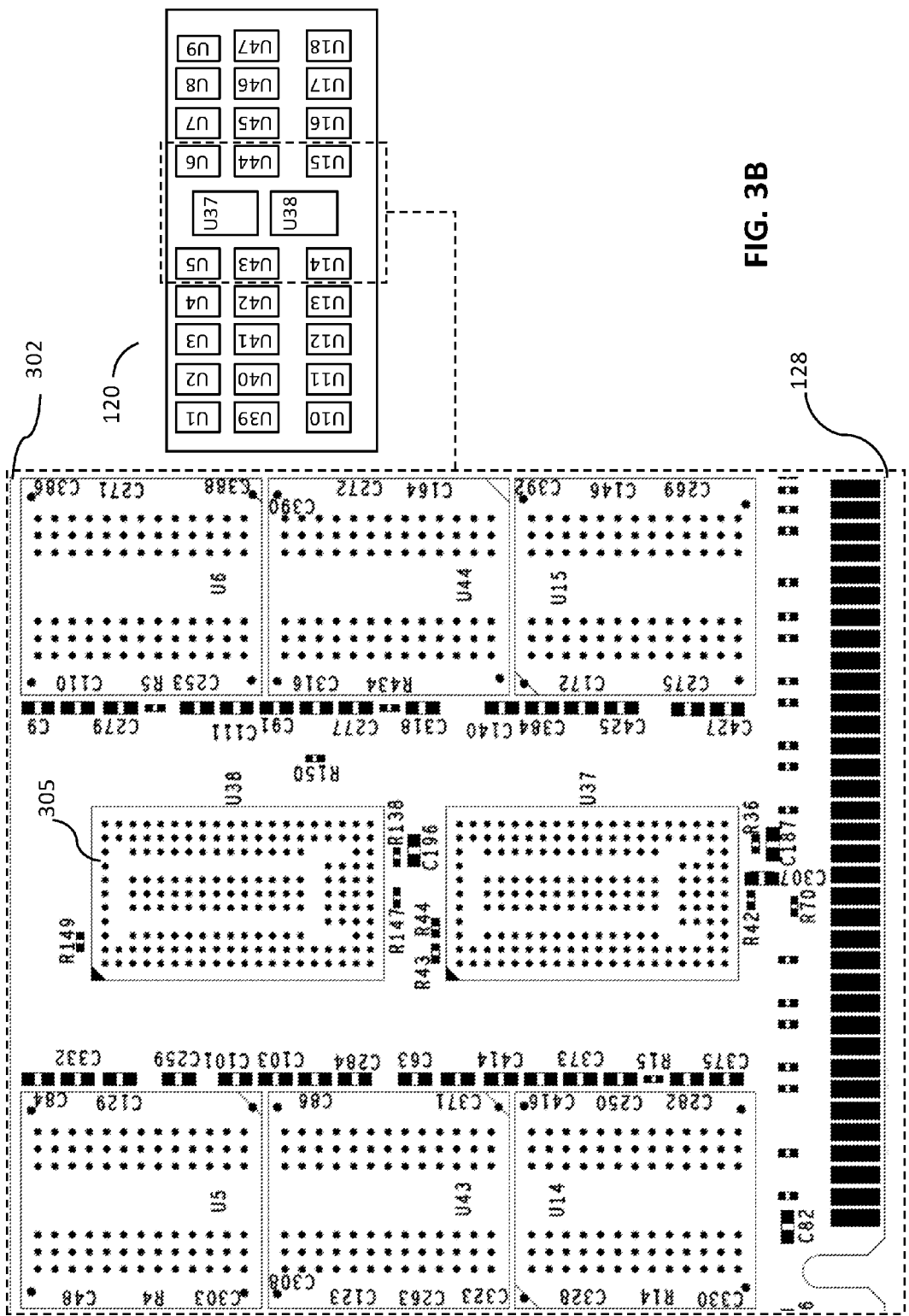

In one embodiment, as shown in FIGS. 3A and 3B, which illustrates blown-up views of portions of the front side 120a of the memory module 120, the module board 122 has a bottom edge 128 and a top edge 302, the memory devices and the register devices include input/output (I/O) pins 305 in the form of, for example, contact pads or solder balls, that are connected to corresponding contact pads/pins or solder balls on the module board 122. Memory module 120 further includes module connectors 126 disposed near the bottom edge 128 of the module board. The memory module 120 may also include discrete components such as capacitors and resisters disposed on the one or both sides of the module board, as also illustrated in FIGS. 3A and 3B.

Figure 3C:
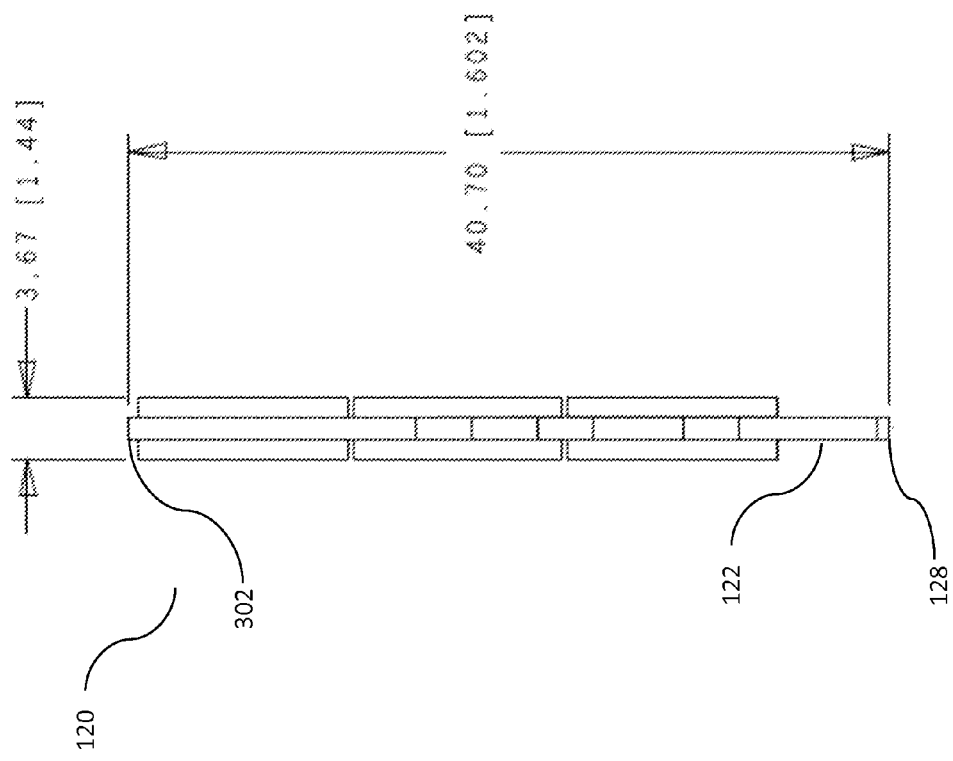
FIG. 3C is a side view of a memory module illustrating dimensions thereof according to one embodiment of the present disclosure.

In one embodiment, the module board 122 is a multi-layered PCB board (e.g., 12-layered PCB board). The memory module has a height (distance between the bottom edge 128 and the top edge 302) equal to or less than about 47 mm. In a further embodiment, the height is about 46.5 mm. In a further embodiment, as shown in FIG. 3C, the height is about 40.7 mm. Reduction in height is made possible by placing both of the register devices U37 and U38 on the primary side 120a of the memory module 120. Placing both of the register devices U37 and U38 on the primary side 120a also results in improved signal integrity and better routing of signal lines/traces and placement of discrete components in/on the module board for this multi-rank memory module.

The module connectors 126 include input/output (I/O) pins such as data/strobe pins, via which data/strobe signals are communicated between the memory devices and the memory controller 110, and control/address (C/A) pins, via which C/A signals are received from the memory controller 110. For example, in one embodiment, the module connectors 126 include the following I/O pins disposed near the bottom edge 128 of the module board 122 on the front side 120a, arranged from the left edge A of the module board 122 to the right edge A' of the module board 122 in the order of, for example: DQ0, DQ1, DQS0#, DQS0, DQ2, DQ3, DQ8, DQ9, DQS1#, DQS1, DQ10, DQ11, DQ16, DQ17, DQS2#, DQS2, DQ18, DQ19, DQ24, DQ25, DQS3#, DQS3, DQ26, DQ27, CB0, CB1, DQS8#, DQS8, CB2, CB3, CKE0, BA2, ERROUT#, A11, A7, A5, A4, A2, CK1, CK1#, PAR_IN, A10, BA0, WE, CAS, CS1, ODT1, CS2, DQ32, DQ33, DQS4#, DQS4, DQ34, DQ35, DQ40, D41, DQS5#, DQS5, DQ42, DQ43, DQ48, DQ49, DQS6#, DQS6, DQ50, DQ51, DQ56, DQ57, DQS7#, DQS7, DQ58, DQ59, SA0, SCL, SA2.

The module connectors 126 also include the following I/O pins disposed near the bottom edge 128 of the module board 122 on the back side 120b, arranged from the left edge A of the module board 122 to the right edge A' of the module board 122, in the order of, for example: DQ4, DQ5, DQS9#, DQS9, DQ6, DQ7, DQ12, DQ13, DQS10, DQS10#, DQ14, DQ15, DQ20, DQ21, DQS11, DQS11#, DQ22, DQ23, DQ28, DQ29, DQS12, DQS12#, DQ30, DQ31, CB4, CB5, DQS17, DQS17#, CB6, CB7, MCLR, RESET#, CKE1, A15, A14, A12, A9, A8, A6, A3, A1, CK0, CK0#, A0, BA1, RAS, CS0, ODT0, A13, CS3, DQ36, DQ37, DQS13, DQS13#, DQ38, DQ39, DQ44, D45, DQS14, DQS14#, DQ46, DQ47, DQ52, DQ53, DQS15, DQS15#, DQ54, DQ55, DQ60, DQ61, DQS16, DQS16#, DQ62, DQ63, SA1, SDA.

In one embodiment, the register devices, U37 and U38, generate registered control/address (C/A) signals based on control/address (C/A) signals received from the memory controller via respective module connectors 126 and provide the registered C/A signals to the memory devices via signal traces on/in the module board 122.

For example, the register device U37A receives row/column address signals from the memory controller 110 via C/A pins A0 through A15 and corresponding I/O pins 305 of the register device U37A. The register device U37A also receives bank address signals from the memory controller 110 via C/A pins BA0 through BA2 and corresponding I/O pins 305 of the register device U37A. The register device U37A further receives control signals RAS (row address strobe), CAS (column address strobe), WE (write enable), CS0, CS1, CKE0 (clock enable), CKE1, ODT0 (on-die termination), etc. from the memory controller 110 via corresponding C/A pins and corresponding I/O pins of the register device U37A.

In response, the register device U37A outputs registered C/A signals via corresponding I/O pins of the register device U37A. In a further embodiment, the register device outputs two identical sets of registered C/A signals, one toward the left edge A of the module board and one toward the right edge A' of the module board. The first set of the two identical sets of registered C/A signals include, for example, registered row/column address signals A0A, A1A, . . . , A15A, registered bank address signals BA0A, BA1A, and BA2A, and registered control signals RASA, CASA, WEA, CS0A, CS1A, CKE0A, CKE1A, ODT0A. The second set of the two identical sets of registered C/A signals include, for example, registered row/column address signals A0B, A1B, . . . , A15B, registered bank address signals BA0B, BA1B, and BA2B, and registered control signals RASB, CASB, WEB, CS0B, CS1B, CKE0B, CKE1B, ODT0B.

Similarly, the register device U38A receives row/column address signals from the memory controller 110 via C/A pins A0 through A15 and via corresponding I/O pins of the register device U38A. The register device U38A also receives bank address signals from the memory controller 110 via C/A pins BA0 through BA2 and corresponding I/O pins of the register device U38A. The register device U38A further receives control signals RAS (row address strobe), CAS (column address strobe), WE (write enable), CS0, CS1, CKE0 (clock enable), CKE1, ODT0 (on-die termination), etc. from the memory controller 110 via corresponding C/A pins and corresponding I/O pins of the register device U38A.

In response, the register device U38A outputs registered C/A signals via corresponding I/O pins of the register device U38A. In a further embodiment, the register device outputs two identical sets of registered C/A signals, one toward the left edge A of the module board and one toward the right edge A' of the module board. The first set of the two identical sets of registered C/A signals may include, for example, registered row/column address signals A0A_2, A1A_2, . . . , A15A_2, registered bank address signals BA0A_2, BA1A_2, and BA2A_2, and registered control signals RASA_2, CASA_2, WEA_2, CS2A, CKE2A, ODT1A. The second set of the two identical sets of registered C/A signals may include, for example, registered row/column address signals A0B_2, A1B_2, . . . , A15B_2, registered bank address signals BA0B_2, BA1B_2, and BA2B_2, and registered control signals RASB_2, CASB_2, WEB_2, CS2B, CKE2B, ODT1B.

In one embodiment, each respective memory device on the memory module 120 receives a set of registered C/A signals from one of the register devices and, in response thereto, communicate corresponding bits of data and strobe signals with the memory controller 110 via corresponding data/strobe pins of the memory module and corresponding I/O pins of the respective memory device. In one embodiment, each data pin correspond to a corresponding data bit of a data signal, which can be, for example, 72-bit wide or 64-bit wide with or without error correction bits, respectively. In one embodiment, each memory device is 4-bit wide, and a respective group of three memory devices, one from each of the three ranks, correspond to 4 respective data pins.

For example, a first group of memory devices include memory device U1 from the second rank, memory device U19 from the first rank, and memory device U39 from the third rank. Memory device U1 receives the first set of registered C/A signals output by the register device 37A except the chip select signal CS0A and in response communicate corresponding data and strobe bits via data/strobe pins DQ0 DQ1, DQ2, DQ3, DQS0, and DQS0# with the memory controller 110; memory device U19 receives the first set of registered C/A signals output by the register device 37A except the chip select signal CS1A and in response communicate data and strobe signals via data/strobe pins DQ0 DQ1, DQ2, DQ3, DQS0, and DQS0# with the memory controller 110; and memory device U39 receives the first set of registered C/A signals output by the register device 38A and in response communicate data and strobe signals via data/strobe pins DQ0 DQ1, DQ2, DQ3, DQS0, and DQS0# with the memory controller 110.

Also, a second group of memory devices include memory device U10 from the second rank, memory device U28 from the first rank, and memory device U48 from the third rank. Memory device U10 receives the first set of registered C/A signals output by the register device 37A except the chip select signal CS0A and in response communicate corresponding data and strobe bits via data/strobe pins DQ4 DQ5, DQ6, DQ7, DQS9, and DQS9# with the memory controller 110; memory device U28 receives the first set of registered C/A signals output by the register device 37A except the chip select signal CS1A and in response communicate data and strobe signals via data/strobe pins DQ4 DQ5, DQ6, DQ7, DQS9, and DQS9# with the memory controller 110; and memory device U48 receives the first set of registered C/A signals output by the register device 38A and in response communicate data and strobe signals via data/strobe pins DQ4 DQ5, DQ6, DQ7, DQS9, and DQS9# with the memory controller 110.

Each memory device receives the corresponding registered C/A signals from one of the register devices via signal lines in the form of, for example, board traces. Further, each memory device is also coupled to the respective data/strobe pins via signal lines in the form of, for example, board traces.

In certain embodiments, memory module 200 includes contact hubs (such as contact hubs 401 and 402 shown in FIG. 4A) that are positioned away from the bottom edge 128 of the module board 122, and signal lines (such as board traces 411 to 412 shown in FIG. 4A) connecting the respective contact hubs to corresponding ones of the data/strobe pins 126. The contact hubs can be, for example, metal pads or solder balls disposed on or near the primary side or secondary side of the memory module 120, and/or vias in the module board 122.

In one embodiment, each contact hub is coupled to a corresponding I/O pin of each of a group of memory devices including one memory device from each of the ranks. For example, as shown in FIG. 4, in which solid dots 415 represent contact pins on memory devices disposed on the primary side 120a of the memory module 120 and empty dots 416 represent contact pins on memory devices disposed on the secondary side 120b of the memory module 120, contact hub 401 is coupled via star traces 421 to a corresponding contact pin of memory device U1 in the second rank, a corresponding contact pin of memory device U19 in the first rank, and a corresponding contact pin of memory device U39 in the third rank.

Figure 4A:
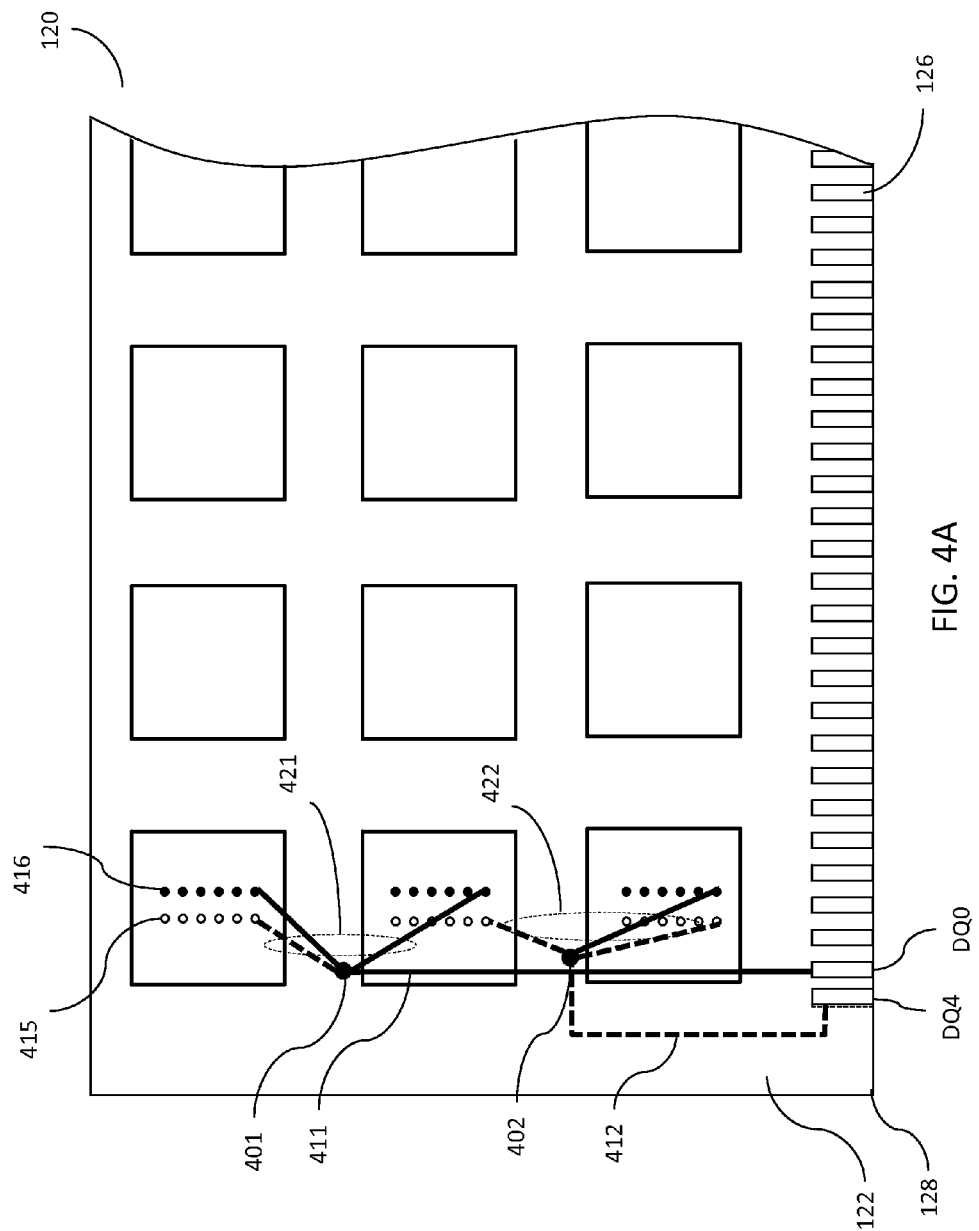
FIG. 4A is a schematic diagram illustrating certain data signal hubs and signal traces on a memory module according to an embodiment of the present disclosure.

Similarly, as also shown in FIG. 4A, contact hub 402 is coupled via star traces 422 to a corresponding contact pin of memory device U10 in the second rank, a corresponding contact pin of memory device U28 in the first rank, and a corresponding contact pin of memory device U48 in the third rank.

Thus, memory devices are connected to the module connectors 126 via the contact hubs and multiple memory devices can be coupled to the respective module connectors via a same set of signal traces on/in the module board 201. For example, as shown in FIG. 4A, memory devices U1, U19, and U39 are coupled to the module connector for DQ0 via a same contact hub 401 and a same signal trace 411.

In one embodiment, each of the contact hubs is positioned to reduce difference in lengths of the signal paths between respective ones of the memory devices coupled thereto and a corresponding module connector. For example, as shown in FIG. 4A, contact hub 401 is positioned to be between memory devices U1 and U39 and closer to memory device U39 in order to reduce differences in the signal path lengths via the star traces 421, resulting in reduced differences in the signal path lengths from memory devices U1, U19, and U39 to each of the module pins for DQ[0:3], DQS0 and DQS0#.

Similarly, as shown in FIG. 4B, contact hub 402 is positioned to be between memory devices U48 and U28 and closer to memory device U28 in order to reduce differences in the signal path lengths via the star traces 422, so as to reduce differences in the signal path lengths from memory devices U10, U28, and U48 to each of the module pins for DQ[4:7], DQS9 and DQS9#.

Further, one or more of the signal traces 411 and 412 may be routed to reduce a difference in length therebetween. As also shown in FIG. 4A, since the contact hub 402 is closer to the bottom edge 128 of the module board 201 than the contact hub 401, the signal trace 412 is routed to make it significantly longer than the distance between the contact hub 402 and the bottom edge 128 of the module board so as to reduce the difference in lengths between signal trace 411 and signal trace 412. Thus, as shown in FIG. 4A, instead of using a straighter path between module connector for DQ4 and contact hub 402, a more circuitous route for the signal trace 412 is used.

In one embodiment, as shown in FIG. 4B, one or more of the star traces 421 may include at least one via 421a and at least one signal trace 421b in at least one different layer of the module board from the other ones of the star traces 421 in order to reach the memory device on a side of the module board that is different from the side on which the contact hub 401 is disposed, or to which the contact hub 401 is closer. In one embodiment, contact hub 401 is disposed on or is closer to the primary side 120a of the memory module 120.

Likewise, one or more of the star traces 422 may include at least one via 422a and at least one signal trace 422b in at least one different layer of the module board in order to reach the memory device on a side of the module board that is different from the side on which the contact hub 402 is disposed, or to which the contact hub 402 is closer. In one embodiment, contact hub 402 is disposed on or is closer to the secondary side 120b of the memory module 120.

The signal traces shown in FIGS. 4A and 4B are exaggerated and straightened for ease of illustration. In practice the signal lines or traces between the module connectors and the contact hubs, and between the contact hubs and the input/output pins of the memory devices are routed around various contacts and/or vias on/in the module board. Each of these traces may include multiple sections in different layers of the module board and may include one or more vias.

FIG. 4C is a side view of the memory module 120 and FIG. 4D is a schematic diagram illustrating electrical couplings between the data/strobe pin DQ0 and memory devices U1, U19, and U39. As shown in FIG. 4D, the signal trace 411 can include one or more board traces 411a in the same or different layers, one or more vias 411b, and one or more discrete component 411c.

In certain embodiments, the memory module 120 can include more than one module boards, and the memory devices can be arranged differently. For example, the memory module 120 can utilize the planar-X technology disclosed in commonly-owned co-pending U.S. patent application Ser. No. 13/653,254, entitled "Circuit with Flexible Portion," filed on Oct. 16, 2012, and U.S. patent application Ser. No. 13/731,034, entitled "Module Having at Least One Thermally Conductive Layer between Printed Circuit Boards," filed on Dec. 30, 2012, each of which is incorporated by reference herein in its entirety. The planar-X technology can provide a more symmetric topology for a 3-ranked memory module with significantly shorter vertical dimension.

Figure 5B:
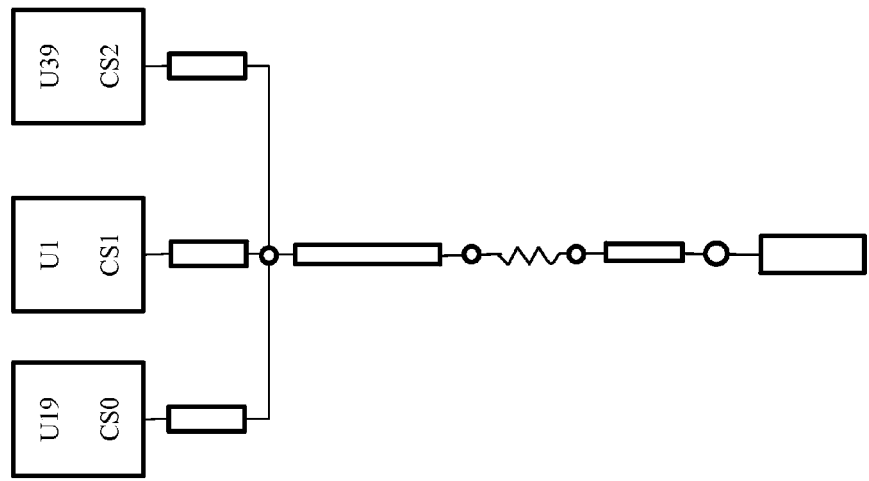
FIG. 5B is a schematic diagram of electrical connections between certain memory devices and a respective module connector via a data signal hub and signal traces according to one embodiment of the present disclosure.
Figure 5A:
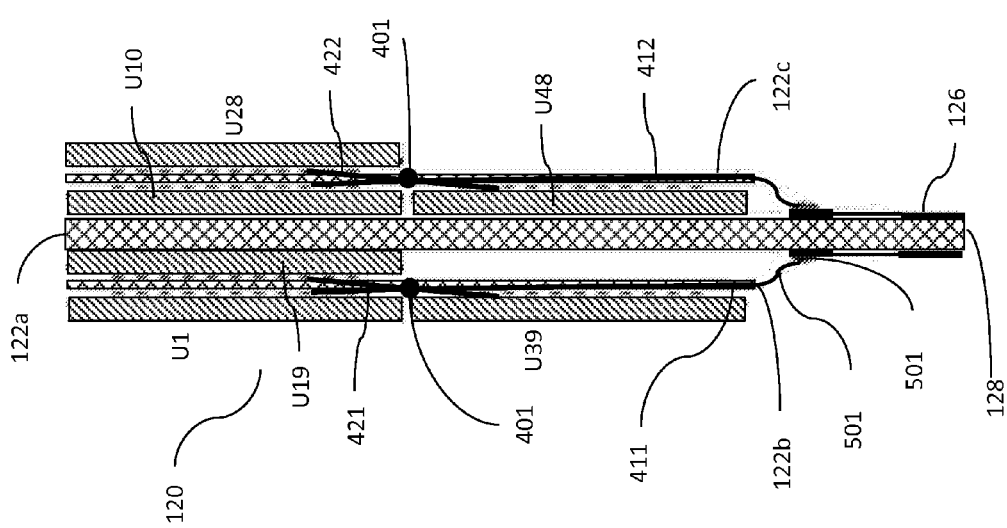
FIG. 5A is a side view of a memory module illustrating arrangement of memory devices and certain data signal hubs and signal traces thereon according to an embodiment of the present disclosure.

As shown in FIG. 5A, the memory module 120 can have a main module board 122a and two daughter boards 122b and 122c each having a flexible portion 500 having flexible traces that are coupled respectively to corresponding contacts 501 on the main module board 122a. Some of the memory devices, such as the first group of memory devices U1, U19, and U39 are mounted on the daughter board 122b, and some of the memory devices, such as the second group of memory devices U10, U28, and U48 are mounted on the daughter board 122c. These memory devices are coupled via signal traces on the daughter boards and the main module board to the module connectors 126 near the bottom edge 128 of the main module board 122a, as shown in FIG. 5A.

For example, as shown in FIG. 5A, the first group of memory devices are coupled to a corresponding data/strobe pin (e.g., DQ0) among the module connectors 126 near the bottom edge 128 of the main module board 122a via star traces 421, contact hub 401, signal trace 411 on the daughter board 122b, a corresponding flexible trace on the flexible portion 501, and a corresponding trace on the main module board 122a. FIG. 5B is a schematic diagram illustrating electrical couplings between the data/strobe pin and memory devices U1, U19, and U39.

Figure 5C:
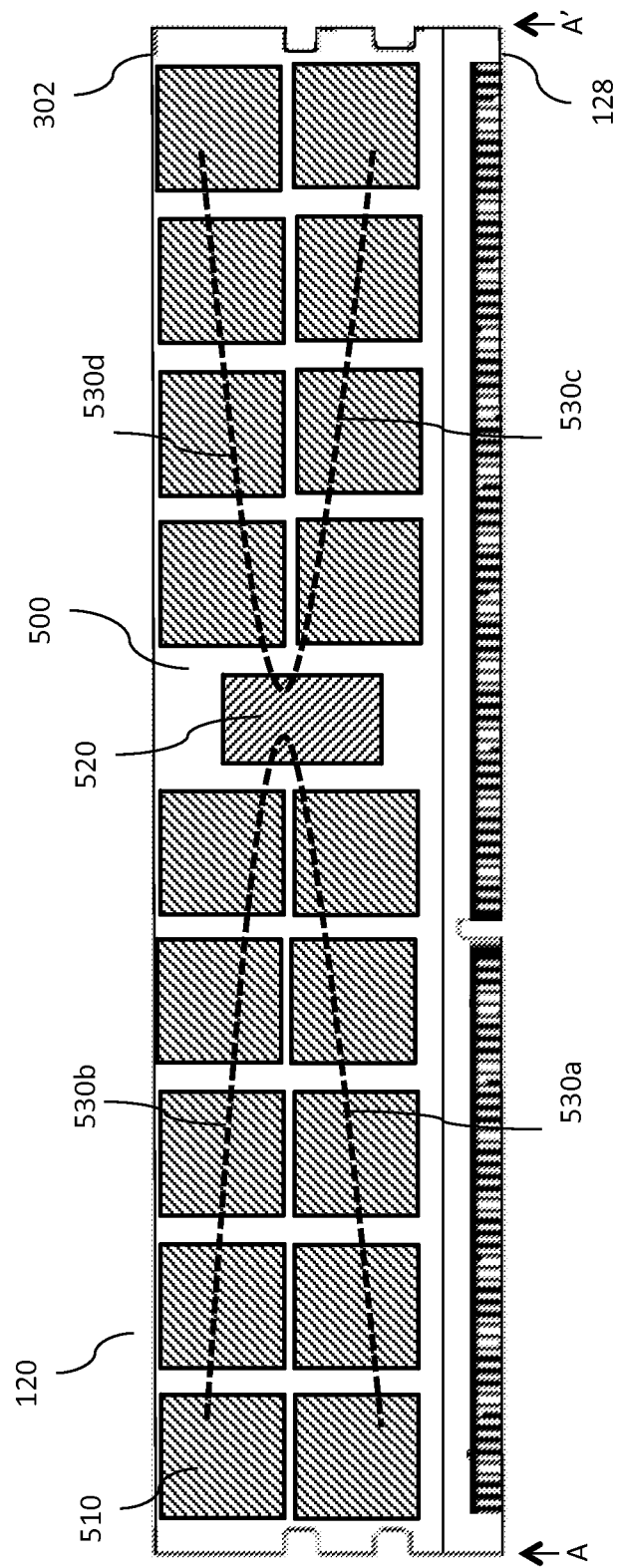
FIG. 5C is a block diagram illustrating memory device loads on registered control/address signals in a memory module according to an embodiment of the present disclosure.

FIG. 5C is a top view of the planar-X multi-rank memory module shown in FIG. 5A, illustrating arrangement of the memory devices 510 and one register 520 on one side of a daughter board 500, which can be either one of the daughter boards 122b and 122c. As shown, the register 520 outputs two sets of registered C/A signals, one toward a left side A of the daughter board 500 and one toward the right side A' of the daughter board 500. The two sets of registered C/A signals are similar to those output by register 37A described above except that each set of registered C/A signals would include three chip select signals CS0, CS1 and CS2 instead of two chip select signals CS0 and CS1. Some of the C/A signals such as the chip select signals are provided respectively to memory devices in different ranks.

The set of registered C/A signals toward the left edge A are output via each of two sets of C/A signal line 530a and 530b to the memory devices 510 disposed between the left edge A and the register device 520. Likewise, the set of registered C/A signals toward the right edge A' are output via each of two sets of C/A signal line 530c and 530d to the memory devices 510 disposed between the left edge A and the register device 520. Thus, the set of signal lines 530b would have twice the amount of memory device load as the set of signal lines 530a. Likewise, the set of signal lines 530d would have twice the amount of memory device load as the set of signal lines 530c. Although this configuration may result in asymmetric loading for registered C/A signals from the registers, with proper termination, good signal quality for the registered C/A signals can be achieved. Note that because two register devices are used, this configuration would result in two register device loads for each pre-registered C/A signal from the memory controller.

Figure 6B:
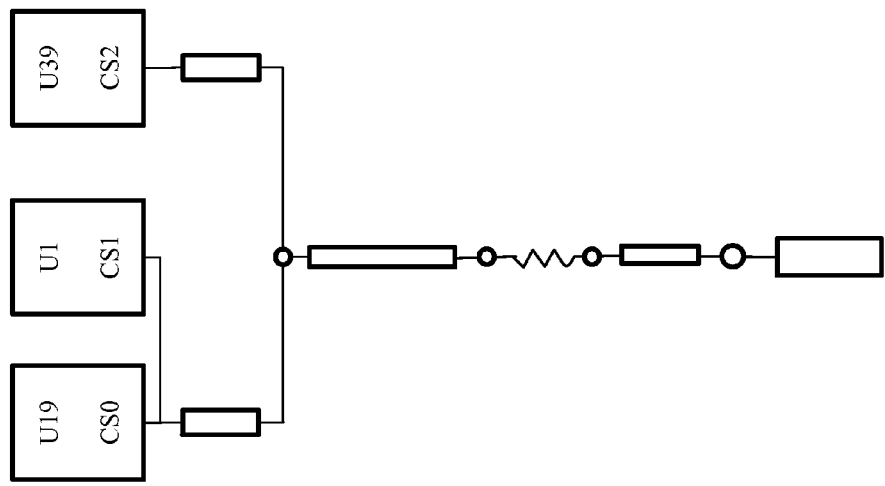
FIG. 6B is a schematic diagram of electrical connections between certain memory devices and a respective module connector via a data signal hub and signal traces according to one embodiment of the present disclosure.
Figure 6A:
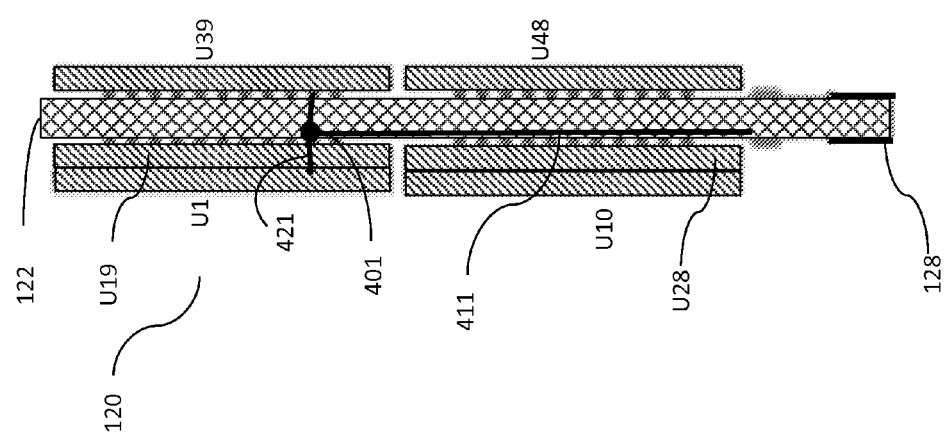
FIG. 6A is a side view of a memory module illustrating arrangement of memory devices and certain data signal hubs and signal traces thereon according to an embodiment of the present disclosure.

FIG. 6A illustrates a planar design for a 3-ranked RDIMM (registered dual in-line memory module) 120 according to embodiments. As shown in FIG. 6A, the 3-ranked RDIMM 120 includes a module board 122, and dual-die packages (DDP) on one side of the module board and single die packages (SDP) on opposite side of the module board 122. This placement can create asymmetric data lines, as the DRAMs located closer to the bottom edge 128 of the module board 122 would have shorter trace length compared to the DRAMs located along the top edge of the module board 122. Also data signals communicated with the DDP would have higher loading compared to data signals communicated with the SDP, as shown in FIG. 6B.

Figure 6C:
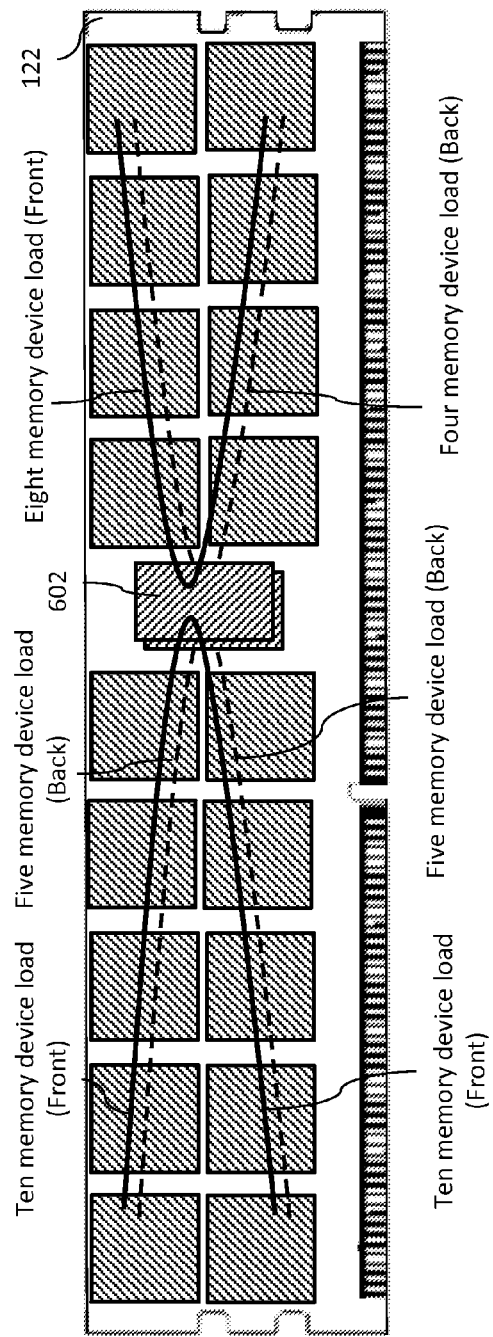
FIG. 6C is a block diagram illustrating memory device loads on registered control/address signals in a memory module having two register devices according to an embodiment of the present disclosure.

FIG. 6C is a top view of the 3-ranked RDIMM shown in FIG. 6A, which utilizes two register devices 602, one on each side of the module board 122 to drive the DRAMs on the same side of the module board. The input/output signals of register 602 on the same side of the DDPs can be the same or similar to the register 37U, and the input/output signals of register 602 on the same side of the SDPs can be the same or similar to the register 38U. In such a configuration, the output of each register would have fairly balanced loading for the registered C/A signals. The register device on the same side of the DDP's, however, would drive twice the number of DRAMs than the register device on the opposite side of the module board. Higher number of resisters can be used to terminate all registered C/A signals to insure good signal quality. Again, this configuration would result in two loads for each pre-registered C/A signal.

Figure 6D:
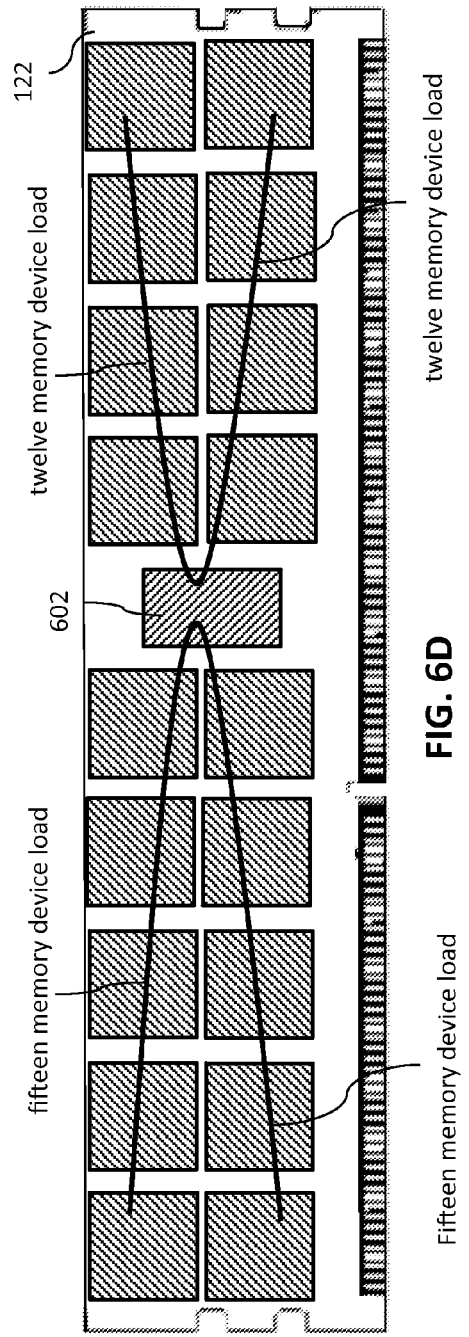
FIG. 6D is a block diagram illustrating memory device loads on registered control/address signals in a memory module using a single register device according to an embodiment of the present disclosure.

FIG. 6D is a top view of the 3-ranked RDIMM shown in FIG. 6A, which utilized only one register device 602 on one side of the module board 122, e.g., the same side of the module board as the DDP's. This register device 602 can be similar to the register 520 (e.g., outputting three chip select signals) and would drive the DRAMs on both sides of the module board 122. This configuration would result in symmetrical loading for the registered C/A signals and one memory device load for each pre-registered C/A signal. It should be more suited for high-speed operation with two DIMM per channel.

We claim:

1. A multi-rank memory module, comprising:
a module board having a first side and an opposing second side; and
memory devices organized in first, second and third ranks, wherein memory devices in the first rank are all mounted on the first side, memory devices in the second rank are all mounted on the second side, and memory devices in the third rank include a first number of memory devices mounted on the first side, and include a second number of memory devices mounted on the second side.

2. The multi-rank memory module of claim 1, further comprising:
module connectors along an edge of the module board, including data/strobe signal pins and control/address (C/A) signal pins; and
data/strobe signal hubs, wherein a respective data/strobe signal hub is coupled to a respective data/strobe signal pin and to a respective set of first, second and third memory devices in different ranks, and wherein the respective data/strobe signal hub is positioned to reduce difference in lengths of first, second and third signal paths, the first signal path between the respective data/strobe signal pin and the first memory device, the second signal path between the respective signal pin and the second memory device, and the third signal path between the respective data/strobe signal pin and the third memory device.

3. The multi-rank memory module of claim 2, wherein the data/strobe signal hubs include a first signal hub and a second signal hub coupled to respective ones of first data/strobe signal pin and second data/strobe signal pin, the multi-rank memory module further comprising a first signal trace between the first data/strobe signal pin and the first signal hub, and a second signal trace between the second data/strobe signal pin and the second signal hub, one of the first and second signal traces being routed to increase its length so as to reduce difference in lengths between the first signal trace and the second signal trace.

4. The multi-rank memory module of claim 2, further comprising: at least one register device mounted on the first side, the at least one register device receiving C/A signals from the memory controller via the C/A signal pins and providing registered C/A signals to the memory devices.

5. The multi-rank memory module of claim 4, wherein the at least one register includes a first register providing registered C/A signals to memory devices in the first rank and second rank, and a second register providing registered C/A signals to memory devices in the third rank.

6. The multi-rank memory module of claim 2, further comprising resisters disposed close to the data/strobe signal pins, wherein the respective data/strobe signal hubs is positioned closer to the first, second and third memory devices than to any of the resisters.

7. The memory module of claim 1, wherein the memory devices in the third rank include a first row of memory devices mounted on the first side and a second row of memory devices mounted on the second side.

8. The memory module of claim 7, further comprising module connectors along an edge of the module board, including data/strobe signal pins and control/address (C/A) signal pins; wherein the memory devices in the first rank include a third row of memory devices mounted on the first side and a fourth row of memory devices mounted on the first side, the third row of memory devices being closer to the module connectors than the fourth row of memory device, and wherein the first row of memory devices are disposed between the third row of memory devices and the fourth row of memory devices.

9. The memory module of claim 7, wherein the memory devices in the second rank include a fifth row of memory devices mounted on the second side and a sixth row of memory devices mounted on the second side, the fifth row of memory devices being closer to the module connectors than the sixth row of memory devices, and wherein the second row of memory devices are disposed between the fifth row of memory devices and the sixth row of memory devices.

10. The memory module of claim 9, wherein a first memory device in the first row of memory devices, a second memory device in the third row of memory devices, and a third memory device in the fifth row of memory devices communicate data with the memory controller through a same first set of data lines.

11. The memory module of claim 10, wherein a fourth memory device in the second row of memory devices, a fifth memory device in the fourth row of memory devices, and a sixth memory device in the sixth row of memory devices communicate data with the memory controller through a same second set of data lines.

* * * * *